(12) United States Patent
Yang et al.

(10) Patent No.: US 12,543,472 B2
(45) Date of Patent: Feb. 3, 2026

(54) DISPLAY SCREEN HAVING A CONTROLLER ELECTRICALLY CONNECTED WITH AN EMISSIVE DISPLAY ASSEMBLY AND A REFLECTIVE LIQUID CRYSTAL DISPLAY ASSEMBLY AND METHOD FOR DISPLAY CONTROL HAVING THE SAME

(71) Applicant: HKC CORPORATION LIMITED, Shenzhen (CN)

(72) Inventors: Wenwu Yang, Guangdong (CN); Rongrong Li, Guangdong (CN)

(73) Assignee: HKC CORPORATION LIMITED, Shenzhen (CN)

(*) Notice: Subject to any disclaimer, the term of this patent is extended or adjusted under 35 U.S.C. 154(b) by 483 days.

(21) Appl. No.: 18/086,239

(22) Filed: Dec. 21, 2022

(65) Prior Publication Data
US 2023/0413640 A1    Dec. 21, 2023

(30) Foreign Application Priority Data
Jun. 20, 2022   (CN) .......................... 202210697409.8

(51) Int. Cl.
  *H01L 29/08* (2006.01)
  *G02F 1/1335* (2006.01)
  (Continued)

(52) U.S. Cl.
  CPC ....... *H10K 59/50* (2023.02); *G02F 1/133509* (2013.01); *G02F 1/133553* (2013.01);
  (Continued)

(58) Field of Classification Search
  CPC ............. H10K 50/50; H10K 59/80524; H10K 59/8051; G02F 1/135509; G02F 1/135503;
  (Continued)

(56) References Cited

U.S. PATENT DOCUMENTS

2006/0170833 A1*  8/2006  Lin ...................... H04N 13/356
                                                    348/E13.044
2007/0146588 A1   6/2007  Yang et al.
(Continued)

FOREIGN PATENT DOCUMENTS

| CN | 1482585 A | 3/2004 |
|---|---|---|
| CN | 1216310 C | 8/2005 |

(Continued)

OTHER PUBLICATIONS

First Office Action issued in corresponding CN Application No. CN202210697409.8, mailed Aug. 8, 2022, pp. 1-10, Beijing, China.

*Primary Examiner* — Phuc T Dang
(74) *Attorney, Agent, or Firm* — HAUPTMAN HAM, LLP (57) ABSTRACT

A display screen and a method for display control are provided in the disclosure. The display screen includes an emissive display assembly, a reflective liquid crystal display assembly, and a controller. The controller is configured to acquire a brightness value of current ambient light, and according to a variation in the brightness value of the ambient light, control the emissive display assembly to work to emit light for display, and/or control the reflective liquid crystal display assembly to work to use the ambient light for display.

18 Claims, 5 Drawing Sheets

(51) Int. Cl.
  *G09G 3/3225* (2016.01)
  *G09G 3/34* (2006.01)
  *G09G 3/36* (2006.01)
  *H10K 59/50* (2023.01)
  *H10K 59/80* (2023.01)
  *H10K 102/10* (2023.01)
(52) U.S. Cl.
  CPC ......... *G09G 3/3225* (2013.01); *G09G 3/3406* (2013.01); *G09G 3/3648* (2013.01); *H10K 59/8051* (2023.02); *H10K 59/80524* (2023.02); *G09G 2300/0426* (2013.01); *G09G 2360/144* (2013.01); *H10K 2102/10* (2023.02)
(58) Field of Classification Search
  CPC .. G09G 3/3225; G09G 3/3406; G09G 3/3648; G09G 2300/0426; G09G 2360/144
  USPC .......................................................... 257/40
  See application file for complete search history.

(56) References Cited

U.S. PATENT DOCUMENTS

2011/0128264 A1* 6/2011 Lee .................. G02F 1/1334
  349/86
2018/0114489 A1 4/2018 Tan et al.

FOREIGN PATENT DOCUMENTS

| | | |
|---|---|---|
| CN | 101004505 A | 7/2007 |
| CN | 105974697 A | 9/2016 |
| CN | 106324877 A | 1/2017 |
| CN | 106526951 A | 3/2017 |
| CN | 106842731 A | 6/2017 |
| CN | 107179638 A | 9/2017 |
| CN | 114171562 A | 3/2022 |
| JP | 2003302517 A | 10/2003 |
| TW | 200821664 A | 5/2008 |

\* cited by examiner

DISPLAY SCREEN HAVING A CONTROLLER ELECTRICALLY CONNECTED WITH AN EMISSIVE DISPLAY ASSEMBLY AND A REFLECTIVE LIQUID CRYSTAL DISPLAY ASSEMBLY AND METHOD FOR DISPLAY CONTROL HAVING THE SAME

CROSS-REFERENCE TO RELATED APPLICATIONS

This application claims priority under 35 U.S.C. § 119 (a) to Chinese Patent Application No. 202210697409.8, filed Jun. 20, 2022, the entire disclosure of which is incorporated herein by reference.

TECHNICAL FIELD

This disclosure relates to the field of display technologies, and particularly to a display screen and a method for display control.

BACKGROUND

With development of technologies of Organic Light-Emitting Diode (OLED) screens and Liquid Crystal Display (LCD) screens, many electronic devices use OLED screens or LCD screens for display. However, a drive current of the OLED screen needs to be increased in environment with relatively high brightness to improve display brightness such that images can be displayed clearly in environment with high brightness, which may accelerate aging of the OLED screen, shorten the lifespan of the OLED screen, and consume more power. LCD screens may include transmissive LCD screens, transflective LCD screens, and reflective LCD screens. The reflective LCD screen can use natural light for display, so backlight is not required and less power is consumed, but the display effect is not good in environment with low brightness.

SUMMARY

In order to solve technical problems mentioned above, display screens and a method for display control are provided in implementations of the disclosure.

In a first aspect of the disclosure, a display screen is provided. The display screen includes an emissive display assembly, a reflective liquid crystal display assembly, and a controller electrically connected with the emissive display assembly and the reflective liquid crystal display assembly. The controller is configured to acquire a brightness value of current ambient light, and according to a variation in the brightness value of the ambient light, selectively control the emissive display assembly to work to emit light for display; control the reflective liquid crystal display assembly to work to use the ambient light for display; or control the emissive display assembly to work to emit light for display, and control the reflective liquid crystal display assembly to work to use the ambient light for display.

In a second aspect of the disclosure, a display screen is provided. The display screen includes an emissive display assembly, a reflective liquid crystal display assembly, and a controller electrically connected with the emissive display assembly and the reflective liquid crystal display assembly. The controller is configured to acquire a brightness value of current ambient light, and control one of the emissive display assembly or the reflective liquid crystal display assembly to work based on a comparison between the brightness value of the current ambient light and at least one preset brightness value.

In a third aspect of the disclosure, a method for display control is provided. The method is applied to a display screen including an emissive display assembly and a reflective liquid crystal display assembly. The method includes: acquiring a brightness value of current ambient light; and according to a variation in the brightness value of the ambient light, selectively controlling the emissive display assembly to work to emit light for display, controlling the reflective liquid crystal display assembly to work to use the ambient light for display, or controlling the emissive display assembly to work to emit light for display and controlling the reflective liquid crystal display assembly to work to use the ambient light for display.

BRIEF DESCRIPTION OF THE DRAWINGS

In order to describe technical solutions of the disclosure more clearly, the following will give a brief illustration of accompanying drawings used for describing the implementations. Apparently, accompanying drawings described below are some implementations of the disclosure. Those of ordinary skill in the art can further obtain other accompanying drawings based on the accompanying drawings without creative efforts.

Reference signs: 1—display screen; 10—emissive display assembly; 11—transparent cathode; 12—light-emitting layer; 13—transparent anode; 20—reflective liquid crystal display assembly; 21—first polarizer; 22—liquid crystal layer; 23—filter layer; 24—second polarizer; 25—reflective layer; 26—transparent common electrode; 27—transparent pixel electrode; 30—controller; 40—first transparent substrate; 50—second transparent substrate; Q10—first TFT; Q11—second TFT; Q12—third TFT.

DETAILED DESCRIPTION

Technical solutions of implementations of the disclosure will be described clearly and completely with reference to accompanying drawings in implementations of the disclosure. Apparently, implementations described herein are merely some implementations of the disclosure, rather than all implementations of the disclosure. Based on the implementations described herein, all other implementations obtained by those of ordinary skill in the art without creative effort shall fall within the protection scope of the disclosure.

Unless stated otherwise, in the illustration of the disclosure, the term "connection" should be understood in broader sense. For example, the connection may be a fixed connection, a detachable connection, or an integrated connection, may be a direct connection, an indirect connection via a medium, or an interconnection between two components, may be a communication connection, or may be an electrical connection. For those of ordinary skill in the art, the above terms in the disclosure can be understood according to specific situations.

In the illustration of the disclosure, the term "and/or" refers to any combination and all possible combinations of one or more of items listed in association, and includes these combinations.

Figure 1:
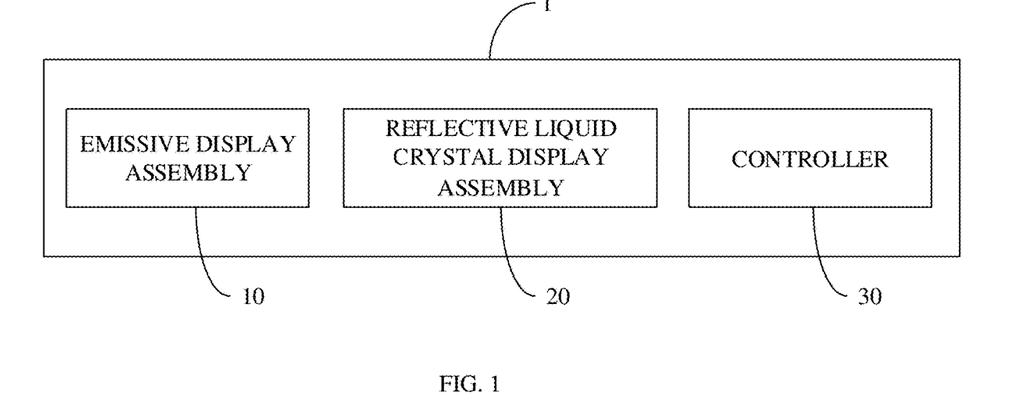
FIG. 1 is a structural block diagram of a display screen provided in implementations of the disclosure.

Refer to FIG. 1, which is a structural block diagram of a display screen provided in implementations of the disclosure.

As illustrated in FIG. 1, in the implementations, the display screen 1 includes an emissive display assembly 10, a reflective liquid crystal display assembly 20, and a controller 30. The controller 30 is connected with the emissive display assembly 10 and the reflective liquid crystal display assembly 20. The controller 30 is configured to acquire a brightness value of current ambient light, and according to a variation in the brightness value of the ambient light, selectively control the emissive display assembly 10 to work to emit light for display; control the reflective liquid crystal display assembly 20 to work to use the ambient light for display; or control the emissive display assembly 10 to work to emit light for display, and control the reflective liquid crystal display assembly 20 to work to use the ambient light for display.

A reflective Liquid Crystal Display (LCD) screen has good display effect and low power consumption in ambient light with high brightness, but has poor display effect in ambient light with low brightness. For an Organic Light-Emitting Diode (OLED) screen, a drive current needs to be increased in ambient light with high brightness to improve display brightness, which may accelerate aging of the OLED screen and shorten lifespan of the OLED screen, and additionally, reflection of ambient light on a surface of the OLED screen may affect the display effect of the OLED screen. Therefore, the display screen 1 described herein includes the emissive display assembly 10 and the reflective liquid crystal display assembly 20, and thus has the advantages of the OLED screen and the advantages of the reflective LCD screen, where the advantages of the OLED screen include good display effect in ambient light with low brightness and a light and slim body, and the advantages of the reflective LCD screen are that eyes can be protected and less power is consumed for the reflective LCD screen uses natural light for display. The advantages of the emissive display assembly 10 are complementary to the advantages of the reflective liquid crystal display assembly 20, such that the display screen 1 may have good display effect in environments with various brightness, relatively low power consumption, a relatively long lifespan, and a light and slim body, and may be easy to be produced via existing technologies.

Furthermore, the controller 30 is configured to control the emissive display assembly 10 not to work and control the reflective liquid crystal display assembly 20 to work to use the ambient light for display, when the brightness value is greater than or equal to a first preset brightness value. The controller 30 is configured to control the emissive display assembly 10 to work to emit light for display and control the reflective liquid crystal display assembly 20 to work to use the ambient light for display, when the brightness value is less than the first preset brightness value and greater than a second preset brightness value, where the second preset brightness value is less than the first preset brightness value. The controller 30 is configured to control the emissive display assembly 10 to work to emit light for display and control the reflective liquid crystal display assembly 20 not to work, when the brightness value is less than or equal to the second preset brightness value.

For the emissive display assembly 10, a drive current needs to be increased in ambient light with relatively high brightness to improve display brightness, such that images can be displayed clearly in environment with high brightness, and additionally, the reflection of the ambient light on a surface of the emissive display assembly 10 may affect the display effect of the emissive display assembly 10. Therefore, when the brightness value of the ambient light is greater than or equal to the first preset brightness value, the reflective liquid crystal display assembly 20 is used to use the ambient light to complete a display task. In this case, the reflective liquid crystal display assembly 20 has good display effect and low power consumption, and there is no need to use the emissive display assembly 10 for display, which is conductive to prolong the lifespan of the emissive display assembly 10. When the brightness value of the ambient light is less than the first preset brightness value and greater than the second preset brightness value, the reflective liquid crystal display assembly 20 continues to use the ambient light to complete a display task together with the emissive display assembly 10, to reduce power consumption. Additionally, instead of being reflected on the surface of the emissive display assembly 10, the ambient light is reflected via the reflective liquid crystal display assembly 20 to be used for display, and thus the ambient light is changed to serve as a resource participating in display from a factor affecting the display effect of the emissive display assembly 10, thereby realizing reasonable and effective resource usage. When the brightness value of the ambient light is less than or equal to the second preset brightness value, the reflection of the ambient light on the surface of the emissive display assembly 10 has little influence on the display effect of the emissive display assembly 10, and the reflective liquid crystal display assembly 20 using the ambient light to assist display is not helpful and power is consumed, and thus only the emissive display assembly 10 is used to emit light for display. According to the brightness value of the ambient light, control the emissive display assembly 10 to emit light and/or control the reflective liquid crystal display assembly 20 to use the ambient light to complete the display task, and thus the advantages of the emissive display assembly 10 and the advantages of the reflective liquid crystal display assembly 20 can be used reasonably.

In the implementations, the emissive display assembly 10 may be, but is not limited to a device that can emit colorful light via their own structures, such as an OLED, an LED and so on. The emissive display assembly 10 adopts a transparent electrode, where a cathode and an anode may both be made from ZnO: Al (AZO), a Single-Walled Carbon Nanotube (SWNT), In2O3:Sn (ITO), etc., which is not limited herein.

Figure 2:
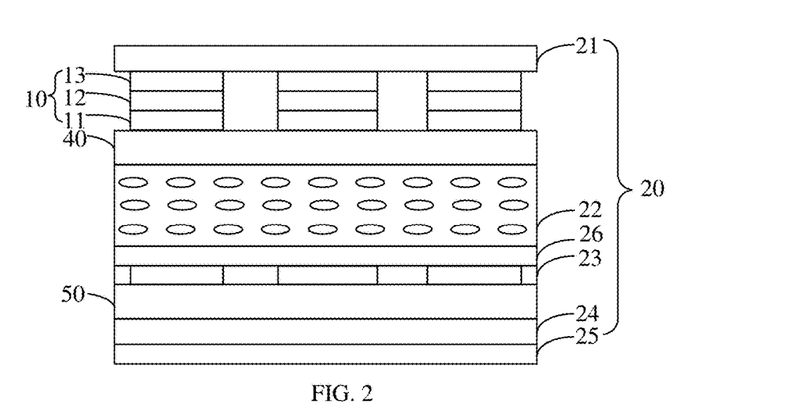
FIG. 2 is a schematic structural view of a display screen provided in some implementations of the disclosure.

Referring to FIG. 1 and FIG. 2 together, FIG. 2 is a schematic structural view of a display screen provided in some implementations of the disclosure.

As illustrated in FIG. 1 and FIG. 2, the reflective liquid crystal display assembly 20 includes a first polarizer 21, a liquid crystal layer 22, a filter layer 23, a second polarizer 24, and a reflective layer 25.

The liquid crystal layer 22, the filter layer 23, and the second polarizer 24 are disposed between the first polarizer 21 and the reflective layer 25.

The emissive display assembly 10 and the liquid crystal layer 22 are disposed between the first polarizer 21 and the second polarizer 24.

The filter layer 23 is disposed between the emissive display assembly 10 and the reflective layer 25.

In the implementations, the display screen 1 includes the emissive display assembly 10 and the reflective liquid crystal display assembly 20. The emissive display assembly 10 can emit light for display during working. The emissive display assembly 10 adopts a transparent electrode, and the ambient light can pass through the emissive display assembly 10. The reflective liquid crystal display assembly 20 can use the ambient light for display. Ambient light in a certain direction enters the display screen 1 from the first polarizer 21, and by controlling deflection angles of liquid crystals corresponding to pixels in the liquid crystal layer 22, the ambient light passes through the second polarizer 24, the ambient light passing through the second polarizer 24 is reflected by the reflective layer 25 to re-enter the second polarizer 24, the ambient light re-entering the second polarizer 24 passes through the first polarizer 21, and the ambient light passes through the filter layer 23 to present a specific color, to realize display.

The liquid crystal layer 22 includes liquid crystals and alignment films.

The controller 30 can acquire the brightness value of the light when an optical sensor detects the brightness value of the light.

The material of the reflective layer may be, but is not limited to, a non-metallic polymer, any one of or an alloy combined by gold, silver, copper, or aluminum. The non-metallic polymer can adopt a Minnesota Mining and Manufacturing (3M) Enhanced Specular Reflector (ESR) film, Polyethylene Terephthalate (PET), Polypropylene (PP), etc. with good reflective effect.

The filter layer 23 includes a Black Matrix (BM) and a Color Film (CF).

Furthermore, the display screen 1 further includes a first transparent substrate 40 and a second transparent substrate 50. From the emissive display assembly 10, the first transparent substrate 40, the liquid crystal layer 22, the filter layer 23, the second transparent substrate 50, and the second polarizer 24 are arranged sequentially between the emissive display assembly 10 and the reflective layer 25.

It is described that from "A", "B", "C", "D", etc., are arranged sequentially between "A" and "Z", which only means that the relative position of them is "A", "B", "C", "D" . . . "Z", but other structures can be arranged between "A" and "B", "B" and "C", or "C" and "D", etc.

The first transparent substrate 40 and the second transparent substrate 50 may be, but are not limited to transparent glass substrates.

In the implementations, when the emissive display assembly 10 in the display screen 1 emits light for display, the light emitted can be seen by a user merely by passing through the first polarizer 21, and thus loss in light is relatively low and display effect is relatively good.

Furthermore, the reflective liquid crystal display assembly 20 includes a transparent common electrode 26, and the emissive display assembly 10 includes a transparent cathode 11 and a transparent anode 13. The transparent common electrode 26 is arranged between the liquid crystal layer 22 and the filter layer 23, and an electric field is generated between the transparent cathode 11 and the transparent common electrode 26 to change directions of the liquid crystals in the liquid crystal layer 22. The emissive display assembly 10 emits light when the transparent cathode 11 and the transparent anode 13 are in a conducting state.

A light-emitting layer 12 is further arranged between the transparent cathode 11 and the transparent anode 13.

The transparent cathode 11 and Thin-Film Transistors (TFTs) are both arranged between the light-emitting layer 12 and the first transparent substrate 40.

In the implementations, the transparent cathode 11 of the emissive display assembly 10 also serves as a pixel electrode of the reflective liquid crystal display assembly 20, which can make the structure of the display screen 1 more compact.

Figure 3:
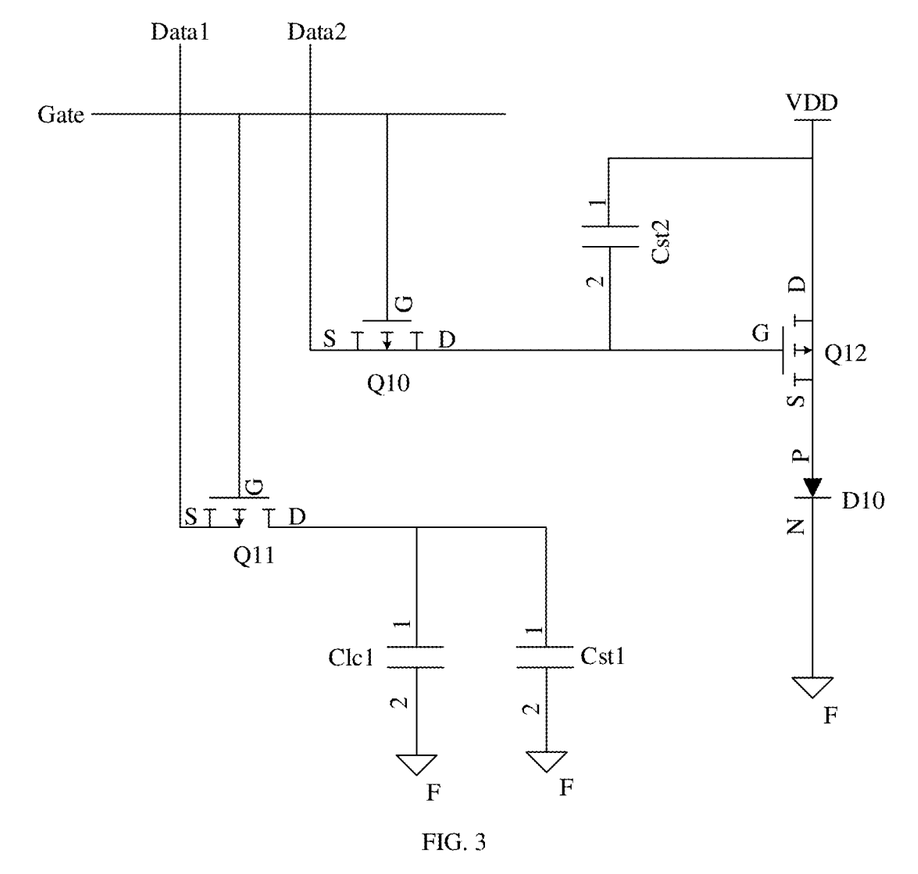
FIG. 3 is a schematic diagram of a Thin-Film Transistor (TFT) circuit provided in some implementations of the disclosure.

Referring to FIG. 2 and FIG. 3 together, FIG. 3 is a schematic diagram of a TFT circuit provided in some implementations of the disclosure.

As illustrated in FIG. 2 and FIG. 3, the transparent cathode 11 of the emissive display assembly 10 also serves as the pixel electrode of the reflective liquid crystal display assembly 20. A first TFT Q10 and a second TFT Q11 are connected to the same gate (G for short) and different data lines. The first TFT Q10 is connected to data line 2 (Data2), and the second TFT Q11 is connected to data line 2 (Data1). A drain (D for short) of the second TFT Q11 is connected to the transparent cathode 11 (i.e. pixel electrode). Each pixel unit in FIG. 3 may be regarded as that a liquid crystal layer is sandwiched between a pixel electrode and a common electrode, where the liquid crystal layer is equivalent to Clc1. Additionally, in order to keep the charged voltage until the next picture update, a storage capacitor (represented by Cst1) is provided. A drain (D) of the first TFT Q10 is connected to a power line (Voltage Drain Drain (VDD)) via a storage capacitor (represented by Cst2), and is connected to a gate (G) of a third TFT Q12. A drain (D) of the third TFT Q12 is connected to the power line (VDD). A source (S for short) of the third TFT Q12 is connected to the transparent anode 13 (represented by D10 in FIG. 3) of the emissive display assembly 10.

When a display voltage is applied to the transparent cathode 11 (i.e. pixel electrode) via the Data1, an electric field is generated between the transparent cathode 11 and the transparent common electrode 26, and the reflective liquid crystal display assembly 20 works for display. At the same time, a voltage equal to the display voltage in magnitude is applied to the transparent anode 13 via the Data2, and thus the emissive display assembly 10 cannot work.

When a display voltage is applied to the transparent cathode 11 (i.e. pixel electrode) via the Data1, an electric field is generated between the transparent cathode 11 and the transparent common electrode 26, the reflective liquid crystal display assembly 20 works for display. At the same time, a voltage unequal to the display voltage in magnitude is applied to the transparent anode 13 via the Data2, and thus the emissive display assembly 10 can also emit light for display.

When a voltage not for display is applied to the transparent cathode 11 (i.e. pixel electrode) via the Data1, no electric field can be generated between the transparent cathode 11 and the transparent common electrode 26, and the reflective liquid crystal display assembly 20 cannot work for display. At the same time, a voltage unequal to the voltage not for display in magnitude is applied to the transparent anode 13 via the Data2, and thus the emissive display assembly 10 can emit light for display.

Figure 4:
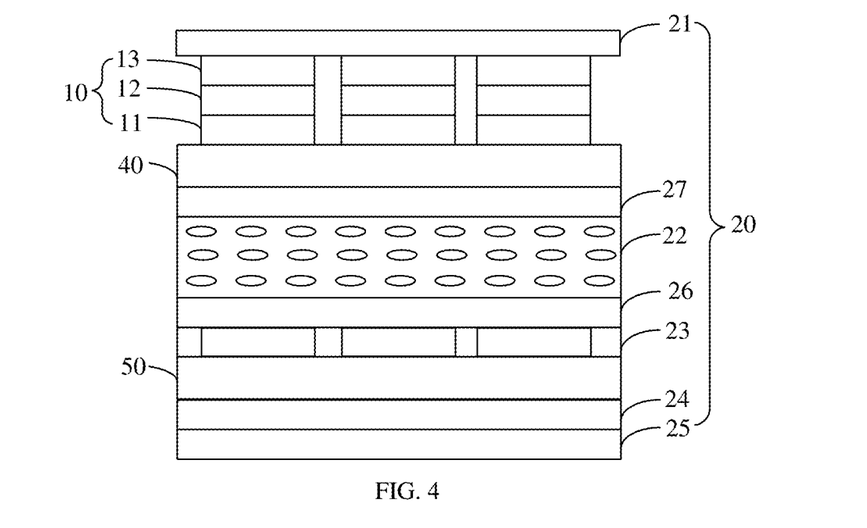
FIG. 4 is a schematic structural view of a display screen provided in other implementations of the disclosure.

Referring to FIG. 4, FIG. 4 is a schematic structural view of a display screen provided in other implementations of the disclosure.

As illustrated in FIG. 4, the display screen illustrated in FIG. 4 is similar to the display screen illustrated in FIG. 2, but the difference between the display screen illustrated in FIG. 4 and the display screen illustrated in FIG. 2 is as follows. In the display screen illustrated in FIG. 4, the reflective liquid crystal display assembly 20 further includes a transparent pixel electrode 27 arranged between liquid crystal layer 22 and the first transparent substrate 40, the transparent common electrode 26 and the transparent pixel electrode 27 are respectively located at two sides of the liquid crystal layer 22, and an electric field is generated between the transparent pixel electrode 27 and the transparent common electrode 26 to change directions of the liquid crystals in the liquid crystal layer 22. Similar to the display screen illustrated in FIG. 2, in the display screen illustrated in FIG. 4, the emissive display assembly 10 includes the transparent cathode 11 and the transparent anode 13, and emits light when the transparent cathode 11 and the transparent anode 13 are in a conducting state.

Compared with the display screen illustrated in FIG. 2, in the display screen illustrated in FIG. 4, the transparent pixel electrode 27 and the transparent cathode 11 are disposed separately, and thus can be controlled by different TFTs. It can be understood that, in other implementations, the transparent common electrode 26 and the transparent pixel electrode 27 may also be disposed at the same side of the liquid crystal layer 22.

Figure 5:
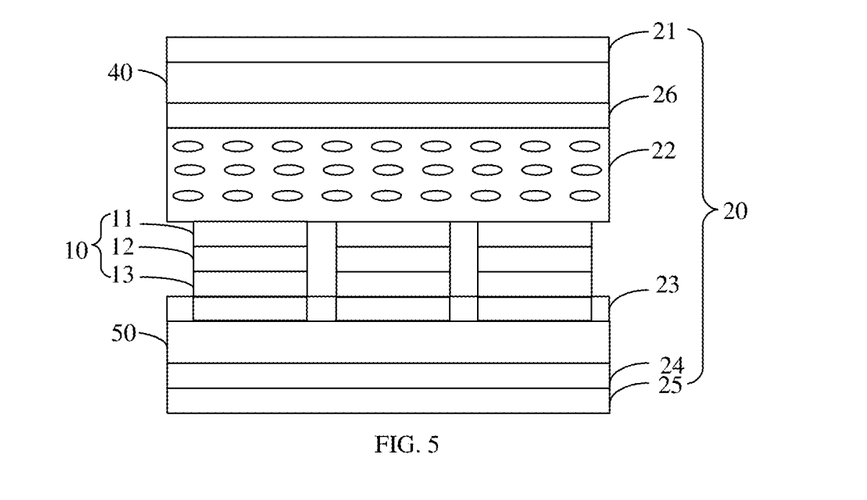
FIG. 5 is a schematic structural view of a display screen provided in other implementations of the disclosure.

Referring to FIG. 5, FIG. 5 is a schematic structural view of a display screen provided in other implementations of the disclosure.

As illustrated in FIG. 5, the display screen illustrated in FIG. 5 is similar to the display screen illustrated in FIG. 2, but the difference between the display screen illustrated in FIG. 5 and the display screen illustrated in FIG. 2 is as follows. In the display screen illustrated in FIG. 5, from the emissive display assembly 10, the liquid crystal layer 22, the transparent common electrode 26, and the first transparent substrate 40 are arranged sequentially between the emissive display assembly 10 and the first polarizer 21, and from the reflective layer 25, the second polarizer 24, the second transparent substrate 50, and the filter layer 23 are arranged sequentially between the reflective layer 25 and the emissive display assembly 10.

Furthermore, the reflective liquid crystal display assembly 20 includes the transparent common electrode 26, and the emissive display assembly 10 includes the transparent cathode 11 and the transparent anode 13. The transparent common electrode 26 is arranged between the first transparent substrate 40 and the liquid crystal layer 22, and the transparent common electrode 26 cooperates with the transparent cathode 11 to generate an electric field to change directions of the liquid crystals in the liquid crystal layer 22. The emissive display assembly 10 emits light when the transparent cathode 11 and the transparent anode 13 are in a conducting state.

The difference between the display screen illustrated in FIG. 5 and the display screen illustrated in FIG. 2 is as follows. In the display screen illustrated in FIG. 5, the emissive display assembly 10 is disposed between the liquid crystal layer 22 and the filter layer 23, and the transparent cathode 11 of the emissive display assembly 10 also serves as the pixel electrode of the reflective liquid crystal display assembly 20. Therefore, compared with the display screen illustrated in FIG. 2, in the display screen illustrated in FIG. 5, the structure of the emissive display assembly 10 is inverted, and the transparent common electrode 26 is correspondingly disposed relative to the transparent cathode 11 at the other side of the liquid crystal layer 22. It can be understood that, in other implementations, the transparent common electrode 26 and the transparent cathode 11 may also be disposed at the same side of the liquid crystal layer 22.

Figure 6:
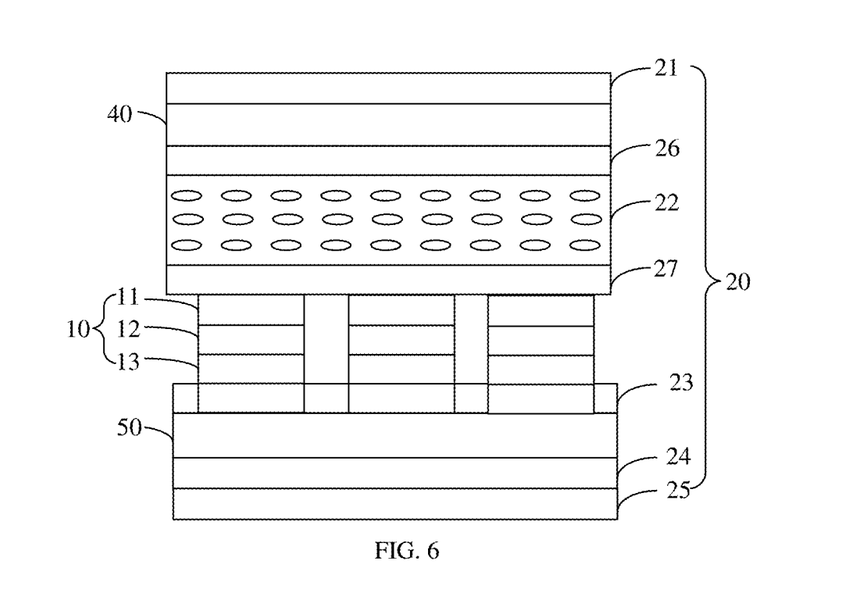
FIG. 6 is a schematic structural view of a display screen provided in other implementations of the disclosure.

Referring to FIG. 6, FIG. 6 is a schematic structural view of a display screen provided in other implementations of the disclosure.

As illustrated in FIG. 6, the display screen illustrated in FIG. 6 is similar to the display screen illustrated in FIG. 5, but the difference between the display screen illustrated in FIG. 6 and the display screen illustrated in FIG. 5 is as follows. In the display screen illustrated in FIG. 6, the reflective liquid crystal display assembly 20 further includes the transparent pixel electrode 27, the transparent common electrode 26 and the transparent pixel electrode 27 are respectively located at two sides of the liquid crystal layer 22, and the transparent common electrode 26 cooperates with the transparent pixel electrode 27 to generate an electric field to change directions of the liquid crystals in the liquid crystal layer 22.

Similar to the display screen illustrated in FIG. 5, in the display screen illustrated in FIG. 6, the emissive display assembly 10 includes the transparent cathode 11 and the transparent anode 13, and emits light when the transparent cathode 11 and the transparent anode 13 are in a conducting state.

The display screen illustrated in FIG. 6 differs from the display screen illustrated in FIG. 5 in that the transparent pixel electrode 27 and the transparent cathode 11 are disposed separately, and thus can be controlled by different TFTs. The structure can also be realized via the existing manufacturing process, and is feasible. It can be understood that, in other implementations, the transparent common electrode 26 and the transparent pixel electrode 27 may also be disposed at the same side of the liquid crystal layer 22.

Figure 7:
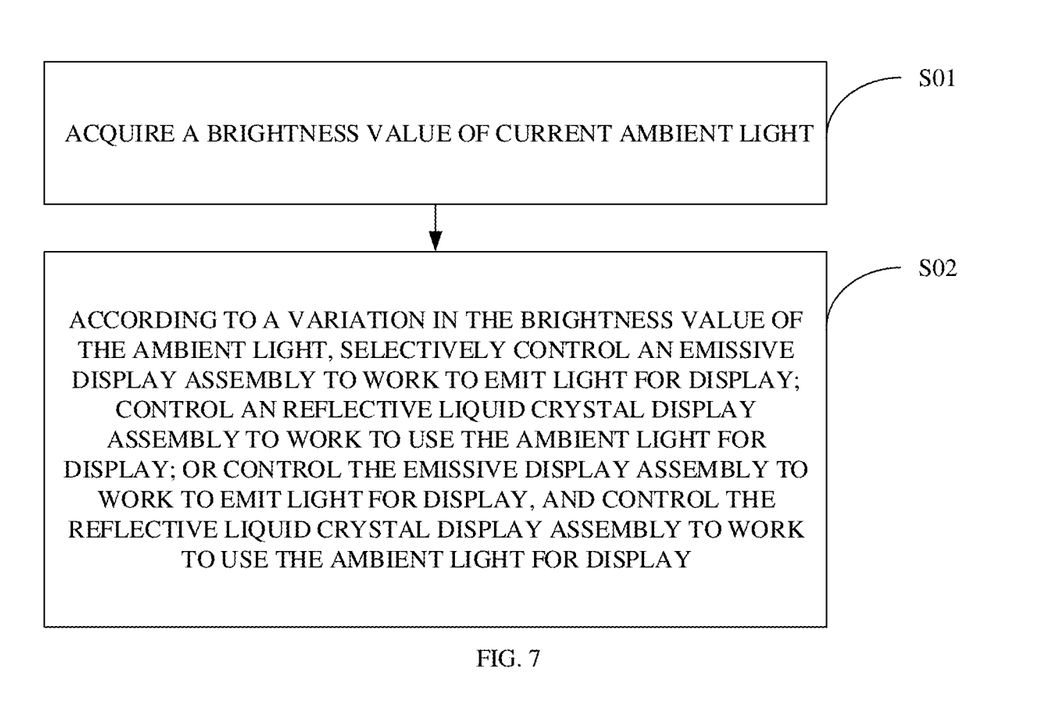
FIG. 7 is a flow chart of a method for display control provided in implementations of the disclosure.

Referring to FIG. 7, FIG. 7 is a flow chart of a method for display control provided in implementations of the disclosure.

The method for display control is applied to a display screen. The display screen includes an emissive display assembly and a reflective liquid crystal display assembly. As illustrated in FIG. 7, the method includes the following.

At S01, acquire a brightness value of current ambient light.

At S02, according to a variation in the brightness value of the ambient light, selectively control the emissive display assembly to work to emit light for display; control the reflective liquid crystal display assembly to work to use the ambient light for display; or control the emissive display assembly to work to emit light for display, and control the reflective liquid crystal display assembly to work to use the ambient light for display.

In the implementations, for the emissive display assembly, a drive current needs to be increased in ambient light with relatively high brightness to improve display brightness, such that images can be displayed clearly in environment with high brightness, and additionally, reflection of the ambient light on a surface of the emissive display assembly may affect the display effect of the emissive display assembly. For the reflective liquid crystal display assembly, the display effect is poor in ambient light with low brightness, but in environment with high brightness, the display effect is good and power consumption is low, and using natural light for display by the reflective liquid crystal display assembly can protect eyes. Therefore, according to the variation in the brightness value of the ambient light, selectively control the emissive display assembly to work to emit light for display; control the reflective liquid crystal display assembly to work to use the ambient light for display; or control the emissive display assembly to work to emit light for display, and control the reflective liquid crystal display assembly to work to use the ambient light for display. Therefore, the advantages of the emissive display assembly are complementary to the advantages of the reflective liquid crystal display assembly, such that the display screen can have good display effect in environments with various brightness, have relatively low power consumption, a relatively long lifespan, a light and slim body, and is easier to be produced via existing technologies.

Figure 8:
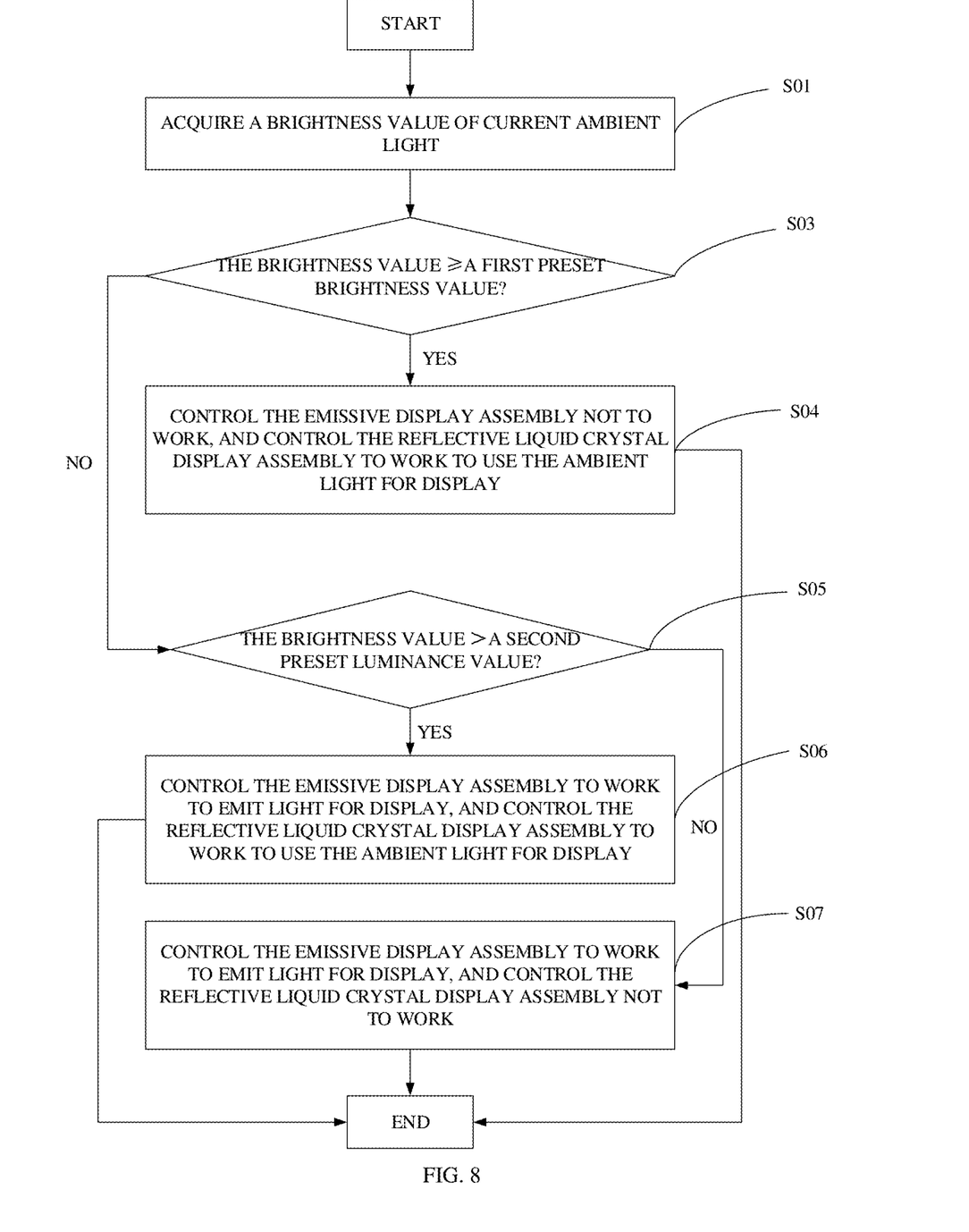
FIG. 8 is a further flow chart of a method for display control provided in implementations of the disclosure.

Referring to FIG. 8, FIG. 8 is a further flow chart of a method for display control provided in implementations of the disclosure.

Furthermore, as illustrated in FIG. 8, after acquiring the brightness value of the current ambient light at S01, at S02, according to the variation in the brightness value of the ambient light, selectively "control the emissive display assembly to work to emit light for display; control the reflective liquid crystal display assembly to work to use the ambient light for display; or control the emissive display assembly to work to emit light for display, and control the reflective liquid crystal display assembly to work to use the ambient light for display" is as follows.

At S03, determine whether the brightness value is greater than or equal to a first preset brightness value. If yes, execute S04: control the emissive display assembly not to work, and control the reflective liquid crystal display assembly to work to use the ambient light for display.

If no, execute S05: determine whether the brightness value is greater than a second preset brightness value. If yes, execute S06: control the emissive display assembly to work to emit light for display, and control the reflective liquid crystal display assembly to work to use the ambient light for display.

If no, execute S07: control the emissive display assembly to work to emit light for display, and control the reflective liquid crystal display assembly not to work.

In the implementations, for the emissive display assembly, a drive current needs to be increased in ambient light with relatively high brightness to improve display brightness, such that images can be displayed clearly in environment with high brightness, and additionally, reflection of the ambient light on the surface of the emissive display assembly may affect the display effect of the emissive display assembly. Therefore, when the brightness value of the ambient light is greater than or equal to the first preset brightness value, the reflective liquid crystal display assembly is used to use the ambient light to complete a display task. In this case, the reflective liquid crystal display assembly has good display effect and low power consumption, and there is no need to use the emissive display assembly for display, which is conductive to prolong the lifespan of the emissive display assembly. When the brightness value of the ambient light is less than the first preset brightness value and greater than the second preset brightness value, the reflective liquid crystal display assembly continues to use the ambient light to complete a display task together with the emissive display assembly, to reduce power consumption. Additionally, instead of being reflected on the surface of the emissive display assembly, the ambient light is reflected via the reflective liquid crystal display assembly to be used for display, and thus the ambient light is changed to serve as a resource participating in display from a factor affecting the display effect of the emissive display assembly, thereby realizing reasonable and effective resource usage. When the brightness value of the ambient light is less than or equal to the second preset brightness value, the reflection of the ambient light on the surface of the emissive display assembly has little influence on the display effect of the emissive display assembly, and the reflective liquid crystal display assembly using the ambient light to assist display is not helpful and power is consumed, and thus only the emissive display assembly is used to emit light for display. According to the brightness value of the ambient light, control the emissive display assembly to emit light and/or control the reflective liquid crystal display assembly to use the ambient light to complete the display task, and thus the advantages of the emissive display assembly and the advantages of the reflective liquid crystal display assembly can be used reasonably.

In the foregoing implementations, the illustration of each implementation has its own emphasis. For the parts not described in detail in one implementation, reference may be made to related illustrations in other implementations.

The above are implementation manners of the implementations of the disclosure. It should be noted that for those of ordinary skill in the art, on the premise of not deviating from the principles of the implementations of the disclosure, some improvements and embellishments can be made, which are also considered as the protection scope of the disclosure.

What is claimed is:

1. A display screen, comprising an emissive display assembly, a reflective liquid crystal display assembly, and a controller electrically connected with the emissive display assembly and the reflective liquid crystal display assembly;
    the controller being configured to acquire a brightness value of current ambient light, and according to a variation in the brightness value of the ambient light, selectively
    control the emissive display assembly to work to emit light for display;
    control the reflective liquid crystal display assembly to work to use the ambient light for display; or
    control the emissive display assembly to work to emit light for display, and control the reflective liquid crystal display assembly to work to use the ambient light for display,
    wherein the controller is configured to:
    control the emissive display assembly not to work and control the reflective liquid crystal display assembly to work to use the ambient light for display, when the brightness value is greater than or equal to a first preset brightness value;
    control the emissive display assembly to work to emit light for display and control the reflective liquid crystal display assembly to work to use the ambient light for display, when the brightness value is less than the first preset brightness value and greater than a second preset brightness value, wherein the second preset brightness value is less than the first preset brightness value; or
    control the emissive display assembly to work to emit light for display and control the reflective liquid crystal display assembly not to work, when the brightness value is less than or equal to the second preset brightness value.

2. The display screen of claim 1, wherein
    the reflective liquid crystal display assembly comprises a first polarizer, a liquid crystal layer, a filter layer, a second polarizer, and a reflective layer;
    the liquid crystal layer, the filter layer, and the second polarizer are arranged between the first polarizer and the reflective layer;

the emissive display assembly and the liquid crystal layer are arranged between the first polarizer and the second polarizer, and the first polarizer is perpendicular to the second polarizer; and the filter layer is arranged between the emissive display assembly and the reflective layer.

3. The display screen of claim 2, further comprising a first transparent substrate and a second transparent substrate, wherein from the emissive display assembly, the first transparent substrate, the liquid crystal layer, the filter layer, the second transparent substrate, and the second polarizer are arranged sequentially between the emissive display assembly and the reflective layer.

4. The display screen of claim 3, wherein
the reflective liquid crystal display assembly comprises a transparent common electrode, and the emissive display assembly comprises a transparent cathode and a transparent anode; wherein
the transparent common electrode is arranged between the liquid crystal layer and the filter layer, and an electric field is generated between the transparent cathode and the transparent common electrode to change directions of liquid crystals in the liquid crystal layer; and
the emissive display assembly emits light when the transparent cathode and the transparent anode are in a conducting state.

5. The display screen of claim 3, wherein
the reflective liquid crystal display assembly comprises a transparent pixel electrode and a transparent common electrode, the transparent common electrode and the transparent pixel electrode are respectively located at two sides of the liquid crystal layer, and an electric field is generated between the transparent pixel electrode and the transparent common electrode to change directions of liquid crystals in the liquid crystal layer; and
the emissive display assembly comprises a transparent cathode and a transparent anode, and emits light when the transparent cathode and the transparent anode are in a conducting state.

6. The display screen of claim 2, further comprising a first transparent substrate and a second transparent substrate, wherein
from the emissive display assembly, the liquid crystal layer and the first transparent substrate are arranged sequentially between the emissive display assembly and the first polarizer; and
from the reflective layer, the second polarizer, the second transparent substrate, and the filter layer are arranged sequentially between the reflective layer and the emissive display assembly.

7. The display screen of claim 6, wherein
the reflective liquid crystal display assembly comprises a transparent common electrode, and the emissive display assembly comprises a transparent cathode and a transparent anode; wherein
the transparent common electrode is arranged between the first transparent substrate and the liquid crystal layer, and the transparent common electrode cooperates with the transparent cathode to generate an electric field to change directions of liquid crystals in the liquid crystal layer; and
the emissive display assembly emits light when the transparent cathode and the transparent anode are in a conducting state.

8. The display screen of claim 6, wherein
the reflective liquid crystal display assembly comprises a transparent common electrode and a transparent pixel electrode, the transparent common electrode and the transparent pixel electrode are respectively located at two sides of the liquid crystal layer, and the transparent common electrode cooperates with the transparent pixel electrode to generate an electric field to change directions of liquid crystals in the liquid crystal layer; and
the emissive display assembly comprises a transparent cathode and a transparent anode, and emits light when the transparent cathode and the transparent anode are in a conducting state.

9. A display screen, comprising an emissive display assembly, a reflective liquid crystal display assembly, and a controller electrically connected with the emissive display assembly and the reflective liquid crystal display assembly;
the controller being configured to acquire a brightness value of current ambient light, and control one of the emissive display assembly or the reflective liquid crystal display assembly to work based on a comparison between the brightness value of the current ambient light and at least one preset brightness value.

10. The display screen of claim 9, wherein
the at least one preset brightness value comprises a first preset brightness value and a second preset brightness value less than the first brightness value; and
the controller is configured to:
control the emissive display assembly not to work and control the reflective liquid crystal display assembly to work to use the ambient light for display, when the brightness value is greater than or equal to the first preset brightness value;
control the emissive display assembly to work to emit light for display and control the reflective liquid crystal display assembly to work to use the ambient light for display, when the brightness value is less than the first preset brightness value and greater than the second preset brightness value; and
control the emissive display assembly to work to emit light for display and control the reflective liquid crystal display assembly not to work, when the brightness value is less than or equal to the second preset brightness value.

11. The display screen of claim 9, wherein
the reflective liquid crystal display assembly comprises a first polarizer, a liquid crystal layer, a filter layer, a second polarizer, and a reflective layer;
the liquid crystal layer, the filter layer, and the second polarizer are arranged between the first polarizer and the reflective layer;
the emissive display assembly and the liquid crystal layer are arranged between the first polarizer and the second polarizer, and the first polarizer is perpendicular to the second polarizer; and
the filter layer is arranged between the emissive display assembly and the reflective layer.

12. The display screen of claim 11, further comprising a first transparent substrate and a second transparent substrate, wherein from the emissive display assembly, the first transparent substrate, the liquid crystal layer, the filter layer, the second transparent substrate, and the second polarizer are arranged sequentially between the emissive display assembly and the reflective layer.

13. The display screen of claim 12, wherein
the reflective liquid crystal display assembly comprises a transparent common electrode, and the emissive display assembly comprises a transparent cathode and a transparent anode; wherein the transparent common electrode is arranged between the liquid crystal layer and the filter layer, and an electric field is generated between the transparent cathode and the transparent common electrode to change directions of liquid crystals in the liquid crystal layer; and the emissive display assembly emits light when the transparent cathode and the transparent anode are in a conducting state.

14. The display screen of claim 12, wherein the reflective liquid crystal display assembly comprises a transparent pixel electrode and a transparent common electrode, the transparent common electrode and the transparent pixel electrode are respectively located at two sides of the liquid crystal layer, and an electric field is generated between the transparent pixel electrode and the transparent common electrode to change directions of liquid crystals in the liquid crystal layer; and the emissive display assembly comprises a transparent cathode and a transparent anode, and emits light when the transparent cathode and the transparent anode are in a conducting state.

15. The display screen of claim 11, further comprising a first transparent substrate and a second transparent substrate, wherein from the emissive display assembly, the liquid crystal layer and the first transparent substrate are arranged sequentially between the emissive display assembly and the first polarizer; and from the reflective layer, the second polarizer, the second transparent substrate, and the filter layer are arranged sequentially between the reflective layer and the emissive display assembly.

16. The display screen of claim 15, wherein the reflective liquid crystal display assembly comprises a transparent common electrode, and the emissive display assembly comprises a transparent cathode and a transparent anode; wherein the transparent common electrode is arranged between the first transparent substrate and the liquid crystal layer, and the transparent common electrode cooperates with the transparent cathode to generate an electric field to change directions of liquid crystals in the liquid crystal layer; and the emissive display assembly emits light when the transparent cathode and the transparent anode are in a conducting state.

17. The display screen of claim 15, wherein the reflective liquid crystal display assembly comprises a transparent common electrode and a transparent pixel electrode, the transparent common electrode and the transparent pixel electrode are respectively located at two sides of the liquid crystal layer, and the transparent common electrode cooperates with the transparent pixel electrode to generate an electric field to change directions of liquid crystals in the liquid crystal layer; and the emissive display assembly comprises a transparent cathode and a transparent anode, and emits light when the transparent cathode and the transparent anode are in a conducting state.

18. A method for display control, applied to a display screen comprising an emissive display assembly and a reflective liquid crystal display assembly, the method comprising:

acquiring a brightness value of current ambient light; and according to a variation in the brightness value of the ambient light, selectively controlling the emissive display assembly to work to emit light for display;

controlling the reflective liquid crystal display assembly to work to use the ambient light for display; or controlling the emissive display assembly to work to emit light for display, and controlling the reflective liquid crystal display assembly to work to use the ambient light for display, wherein "according to the variation in the brightness value of the ambient light, selectively controlling the emissive display assembly to work to emit light for display, controlling the reflective liquid crystal display assembly to work to use the ambient light for display, or controlling the emissive display assembly to work to emit light for display and controlling the reflective liquid crystal display assembly to work to use the ambient light for display" comprises:

controlling the emissive display assembly not to work and controlling the reflective liquid crystal display assembly to work to use the ambient light for display, when the brightness value is greater than or equal to a first preset brightness value;

controlling the emissive display assembly to work to emit light for display and controlling the reflective liquid crystal display assembly to work to use the ambient light for display, when the brightness value is less than the first preset brightness value and greater than a second preset brightness value, wherein the second preset brightness value is less than the first preset brightness value; or controlling the emissive display assembly to work to emit light for display and controlling the reflective liquid crystal display assembly not to work, when the brightness value is less than or equal to the second preset brightness value.

\* \* \* \* \*